United States Patent [19]
Akimoto et al.

[11] Patent Number: 4,814,848
[45] Date of Patent: Mar. 21, 1989

[54] SOLID-STATE IMAGING DEVICE

[75] Inventors: Hajime Akimoto, Hachioji; Harushisa Ando, Tokyo; Toshifumi Ozaki, Koganei; Hideyuki Ono, Kokubunji; Shinya Ohba, Kanagawa; Masaaki Nakai, Tokorozawa; Norio Koike, Tokyo, all of Japan

[73] Assignee: Hitachi, Ltd., Tokyo, Japan

[21] Appl. No.: 58,825

[22] Filed: Jun. 5, 1987

[30] Foreign Application Priority Data

Jun. 12, 1986 [JP] Japan .................. 61-134915
Dec. 17, 1986 [JP] Japan .................. 61-298942

[51] Int. Cl.⁴ ............... H01L 29/78; H01L 27/14; H01L 29/06; H01L 3/14
[52] U.S. Cl. ........................ 357/24; 357/30; 357/20; 357/13; 358/213.19; 358/213.31
[58] Field of Search ........... 357/24 LR, 24, 30 D, 357/30 F, 30 J, 13, 20; 358/213.19, 213.31

[56] References Cited

U.S. PATENT DOCUMENTS

| | | | |
|---|---|---|---|
| 4,236,168 | 11/1980 | Herbst | 357/30 D |
| 4,498,013 | 2/1985 | Kuroda et al. | 357/24 LR |
| 4,586,084 | 4/1986 | Imai | 357/24 LR |
| 4,672,455 | 6/1987 | Miyatake | 358/213.19 |
| 4,696,021 | 9/1987 | Kawahara et al. | 357/24 LR |

FOREIGN PATENT DOCUMENTS

| | | | |
|---|---|---|---|
| 21680 | 2/1985 | Japan | 357/30 D |
| 174582 | 9/1985 | Japan | 358/213.19 |
| 182880 | 9/1985 | Japan | 358/213.19 |

Primary Examiner—Martin H. Edlow
Assistant Examiner—Robert P. Limanek
Attorney, Agent, or Firm—Antonelli, Terry & Wands

[57] ABSTRACT

A solid-state imaging device having a plurality of semiconductor layers of a first conductivity type for photoelectric conversion provided on the surface of a first semiconductor layer of a second conductivity type which is formed on a part of one surface of a semiconductor substrate of the first conductivity type, a semiconductor layer of the first conductivity type for charge transfer provided on the surface of a second semiconductor layer of the second conductivity type which is formed on a part of the surface of the substrate, and a signal output means. The first semiconductor layer of the second conductivity type and the second semiconductor layer of the second conductivity type are formed in different steps so that the first semiconductor layer is disposed deeper than the second semiconductor layer.

38 Claims, 7 Drawing Sheets

SOLID-STATE IMAGING DEVICE

BACKGROUND OF THE INVENTION

1. Field of the Invention

The present invention relates to an imaging device and, more particularly, to a solid-state imaging device formed using a semiconductor device.

2. Description of the Related Art

The solid-state imaging device has various advantages over the image pick-up tube, for example, a smaller size, lighter weight, maintenance-free properties and a longer lifetime. As a result of remarkable progress in semiconductor technology, the solid-state imaging device is replacing the image pick-up tube because of its superiority over the latter in terms of production cost and performance.

Such solid-state imaging devices may roughly be classified into two types, that is, the MOS type in which the photo-electric charges are generated in each photo-electric conversion elements (photo-diodes) and are externally read out through an aluminum signal line via MOS transistors, and the CCD type in which the photo-electric charge generated in each photo-electric conversion elements are externally read out by means of CCD (Charge Coupled Device) shift registers.

CCD type solid-state imaging devices include: the frame transfer type in which the imaging area and the storage area are provided independently of each other; the interline type which has stripe-shaped storage and transfer areas; and the FIT (Frame Interline Transfer) type which is a mixture of said two types. Since these CCD type solid-state imaging devices are capable of highly efficiently outputting the photo-electric charges generated in each photo-electric conversion element to the outside, fewer noises are generated therein than in the MOS type solid-state imaging devices, advantageously.

Such a CCD type solid-state imaging device is described in ISSCC 82, p. 168 to 169 and in ISSCC 86, p. 94.

A conventional solid-state imaging device will be described hereinunder with reference to FIGS. 1 and 2. FIG. 1 shows the arrangement of a CCD type solid-state imaging device, and FIG. 2 is a sectional view taken along the line A—A' of FIG. 1.

Each of the photo-electric conversion elements 1 is a photo-diode which is defined by, for example, a pn junction diode, and adapted to convert incident light to an optical signal charge corresponding to the intensity of the incident light and to store the charge. Each of the vertical CCD registers 3-1 and 3-2 is provided for each of the photo-electric conversion element rows (1-1, 1-2, 1-3) and (1-4, 1-5, 1-6) arranged so as to extend vertically as viewed in FIG. 1, the vertical CCD registers being adapted to transfer charges in the vertical direction. Each of the selector gates 2 is provided between the corresponding photo-electric conversion element 1 and vertical CCD register 3 to control the flow of the signal charge from the photo-electric conversion element 1 to the vertical CCD register 3. A horizontal CCD register 11 is provided at either side of the group of vertical CCD registers 3 to receive in parallel signal charges which are respectively transferred through the vertical CCD registers 3 and to transfer the received signal charges in the horizontal direction. An output amplifier 12 is provided at one end of the horizontal CCD register 11 to amplify and output the signal charges transferred through the horizontal CCD register 11.

The optical signal charge stored in each photo-diode 1 is transferred to the corresponding CCD register 3 through the associated selector gate 2. The transferred signal charge is further transferred to the output amplifier 12 through the vertical CCD register 3 and the horizontal CCD register 11 and finally outputted from the output amplifier 12 in the form of an imaging signal.

In general, the vertical CCD registers 3 are driven by 4-phase clocks. Although not shown, 4-phase clock wirings are provided for each vertical CCD register 3, and among the 4-phase clock wirings, those for 2-phases also serve as gate wirings for the selector gates 2.

FIG. 2 is a sectional view taken along the line A—A' of FIG. 1, which shows an imaging area consisting of the photo-diodes 1-3, 1-6, the selector gates 2-3, 2-6 and the vertical CCD registers 3-1, 3-2.

A semiconductor substrate 6 of a first conductivity type (n-type) is formed therein with an impurity layer (well) 13 of a second conductivity type (p-type). An $n^+$-type impurity layer is formed within the p-type impurity layer 13, the $n^+$-type impurity layer being used to constitute the photo-diodes 1-3, 1-6 and respective channel regions 3'-1, 3'-2 of the vertical CCD registers 3. The p-type impurity layer 13 and the $n^+$-type impurity layer constitute in combination the pn junction photo-diodes 1. An optical light charge which is generated in response to light entering the imaging area is stored in the $n^+$-type impurity layer. The photo-diodes 1-3, 1-6 and the channel regions 3'-1, 3'-2 of the vertical CCD registers 3 form source and drain regions of MOS (Metal Oxide Semiconductor) transistors having their gates defined by the selector gates 2-3 and 2-6, respectively. The selector gates 2-3 and 2-6 also serve as transfer electrodes of the vertical CCD registers 3. Insulators 7-1 and 7-2 formed from, the example, $SiO_2$, are insulators for isolation between the photo-diodes 1-3, 1-6 and the channel regions 3'-1, 3'-2 of the vertical CCD registers 3. Gates 8-1 and 8-2 serve as transfer electrodes of the vertical CCD registers 3. Light-shielding films 9-1 and 9-2 made of, for example, aluminum, prevent light from entering the vertical CCD registers 3. An insulator 10 is an insulating film between up and down layers which is made of, for example, $SiO_2$, to isolate adjacent gates from each other.

The solid-state imaging device of the type described above suffers, however, from the following problems. Among rays of light entering the device, some of the components of light which are obliquely incident thereon and the components of light which are reflected from the interface between the $SiO_2$ 10 and the Si substrate 6 may leak in regions within the p-type impurity layer 13 which are in the vicinities of the channel regions 3'-1 and 3'-2 of the vertical CCD registers 3. A part of noise charge which is generated in response to such leakage light may further enter the channel regions 3'-1 and 3'-2 of the vertical CCD registers 3 by the action of diffusion or an electric drift which causes the smear phenomenon that makes the image blurry and unclear.

SUMMARY OF THE INVENTION

It is a primary object of the present invention to provide a solid-state imaging device which is made free from any signal charge that causes the smear phenomenon by suppressing the occurrence of the smear phenomenon.

To this end, the present invention provides a solid-state imaging device comprising: a semiconductor substrate of a first conductivity type; a first semiconductor layer of a second conductivity type which is formed on one surface of the semiconductor substrate; a plurality of second semiconductor layers of the first conductivity type which are two-dimensionally formed on the surface within the first semiconductor layer, each of the second semiconductor layers cooperating with the first semiconductor layer to constitute a photo-electric conversion element; a plurality of third semiconductor layers of the first conductivity type which are formed on the surface within the first semiconductor layer so as to correspond to at least one of the second semiconductor layers; a plurality of selector gates provided through an insulator on the surface of the semiconductor substrate between the second and third semiconductor layers, the selector gates transferring to the third semiconductor layers charges stored in the photo-electric conversion elements in accordance with light incident thereon; means for reading, out the charges transferred to the third semiconductor layers; and the depth of a portion of the first semiconductor layer from the surface of the semiconductor substrate being such that it is formed as a portion opposing the lower surfaces of the second and third semiconductor layers, a greater than the depth of a portion of the first semiconductor layer from the surface of the semiconductor substrate, opposing and underlying the lower surfaces of the third semiconductor layers.

According to the present invention, it is possible to effectively suppress the occurrence of the smear phenomenon.

These and other objects and many of the attendant advantages of this invention will be readily appreciated as the same becomes between understood by reference to the following detailed description when considered in connection with the accompanying drawing.

DESCRIPTION OF THE PREFERRED EMBODIMENTS

Embodiments of the present invention will be described hereinunder in detail with reference to the accompanying drawings.

FIRST EMBODIMENT

Figure 1:
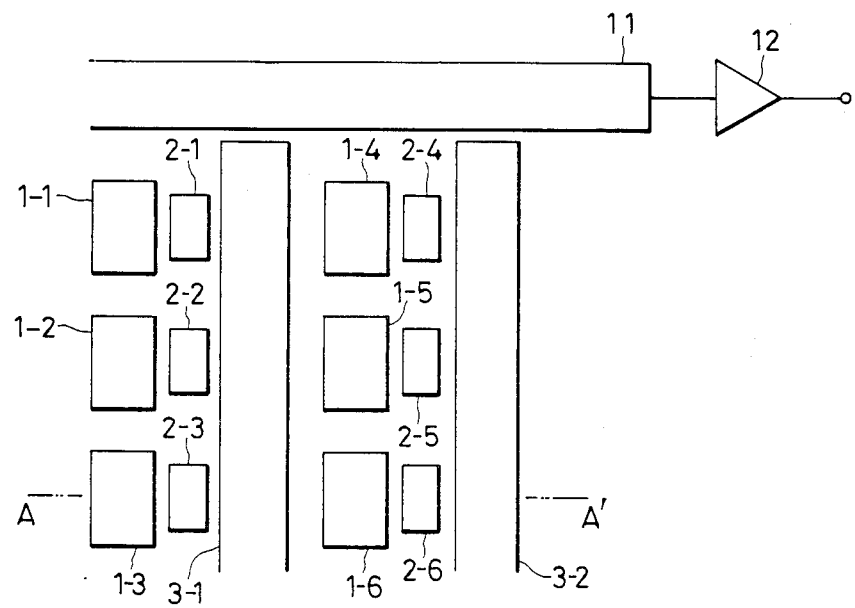
FIG. 1 shows the arrangement of a conventional solid-state imaging device.
Figure 2:
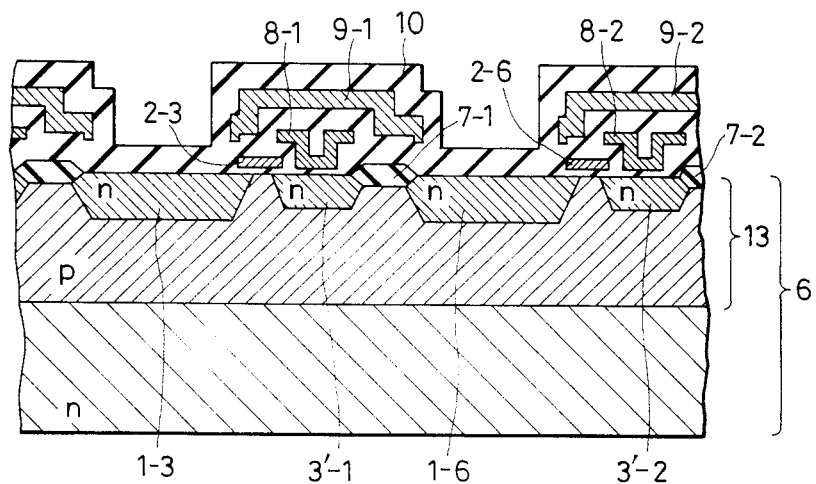
FIG. 2 is a sectional view taken along the line A—A' of FIG. 1, which shows an imaging area of the conventional solid-state imaging device.
Figure 3:
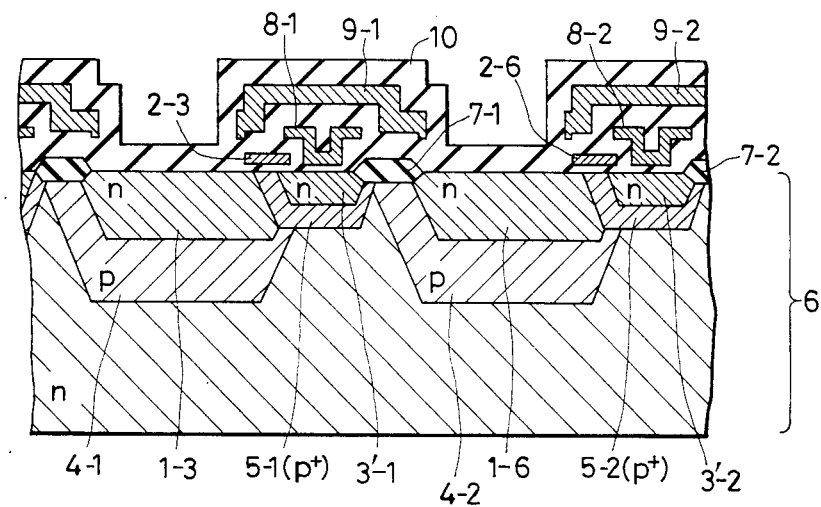
FIG. 3 is a sectional view of an imaging area of a first embodiment of the solid-state imaging device according to the present invention.

FIG. 3 is a sectional view corresponding to FIG. 2, which shows a first embodiment of the present invention. In this figure, portions having the same arrangements as those shown in FIG. 2 are denoted by the same reference numerals.

The first embodiment differs from the prior art shown in FIG. 2 in the structure of p-type impurity layers provided in the n-type semiconductor substrate 6. More specifically, in the first embodiment, p-type impurity layers 4-1, 4-2 around the photo-diodes 1-3, 1-6 on the one hand and p-type impurity layers 5-1, 5-2 around the channel regions 3'-1, 3'-2 of the vertical CCD registers 3 on the other hand are formed in different steps in such a manner that the p-type impurity layers 4-1, 4-2 are disposed deeper in the semiconductor substrate 6 than the p-type impurity layers 5-1, 5-2.

The deeper the p-type impurity layers 4-1, 4-2 provided around the photo-diodes 1-3, 1-6, the higher is the sensitivity and performance of the solid-state imaging device. This is because the transparency S of incident light with respect to Si is represented as follows:

$$S = S_0 e^{-\alpha(\lambda) \cdot x} \tag{1}$$

where $S_0$: the quantity of incident light $\alpha(\lambda)$: a constant dependent upon the wavelength of incident light x: the depth from the plane of incidence of light Accordingly, if the depth of the p-type impurity layers 4-1 and 4-2 around the photo-diodes 1-3 and 1-6 is increased so as to decrease the quantity of light transmitted to regions which are below the impurity layers 4-1 and 4-2, it is possible to obtain an increased number of photoexcited electrons as a signal. On the other hand, the depth of the $p^+$-type impurity layers 5-1 and 5-2 around the channel regions 3'-1 and 3'-2 of the vertical CCD registers 3 is preferably reduced in order to suppress the occurrence of the smear phenomenon. The transparency of light which obliquely enters the device, or which is reflected from the interface between $SiO_2$ and Si, to leak in the $p^+$-type impurity layers 5-1 and 5-2 around the channel regions 3'-1 and 3'-2 of the vertical CCD registers 3 also satisfies the formula (1). Therefore, if the depth of the $p^+$-type impurity layers 5-1 and 5-2 is reduced so as to increase the quantity of light transmitted to regions in the n-type semiconductor substrate 6 which are below the impurity layers 5-1 and 5-2, it is possible to reduce noise charges which are generated in the $p^+$-type impurity layers 5-1 and 5-2 to enter the channel regions 3'-1 and 3'-2 of the vertical CCD registers 3. Although the shallower the $p^+$-type impurity layers 5-1 and 5-2 the better, it is necessary to set the depth of the impurity layers at such a level that no charge is passed between the n-type substrate 6 and the channel regions 3'-1 and 3'-2 of the vertical CCD registers 3. The depth of the p+-type impurity layers 5-1 and 5-2 can be decreased by increasing the impurity concentration in these layers. If the impurity concentration in the p+-type impurity layers 5-1 and 5-2 is increased, depletion layers in the channel regions 3'-1 and 3'-2 of the vertical CCD registers 3 are decreased, so that it becomes difficult for noise charges which cause the smear noise to reach the channel regions 3'-1 and 3'-2, thus suppressing the generation of the smear noise. In this case, however, if the element is formed by ion implantation and diffusion, which are usually employed, the increase in impurity concentration in the p+-type impurity layers 5-1 and 5-2 leads to an increase in impurity concentration in the channel regions 3'-1 and 3'-2 of the vertical CCD registers 3. If the impurity concentration in the channel regions 3'-1 and 3'-2 is increased excessively, the transfer capacity of the vertical CCD registers 3 is undesirably reduced. Therefore, it is necessary to increase the impurity concentration in the p+-type impurity layers 5-1 and 5-2 without increasing the impurity concentration in the channel regions 3'-1 and 3'-2 of the vertical CCD registers 3, and it is preferable, in order to meet this requirement, to implant a p-type impurity into the n-substrate 6 by the use of, for example, the focused ion beam (FIB) method.

To produce the p-type impurity layers 4-1 and 4-2 shown in FIG. 3, a p-type impurity is first implanted into the surface region of the n-type semiconductor substrate 6 using a resist as a mask. Thereafter, the implanted p-type impurity is thermally diffused to form pairs of p-type impurity layers 4-1, 4-2 and 5-1, 5-2 independently of each other. Further, n-type impurity layers 1-3, 1-6 and 3'-1, 3'-2 are formed in the p-type impurity layers 4-1, 4-2 and 5-1, 5-2, respectively, by a similar process using an n-type impurity. The photo-diodes 1-1, 1-2 and the channel regions 3'-1, 3'-2 of the vertical CCD registers 3, thus formed, serve as source and drain regions of MOS transistors having their gates defined by selector gates 2-3 and 2-6, respectively.

SECOND EMBODIMENT

Figure 4:
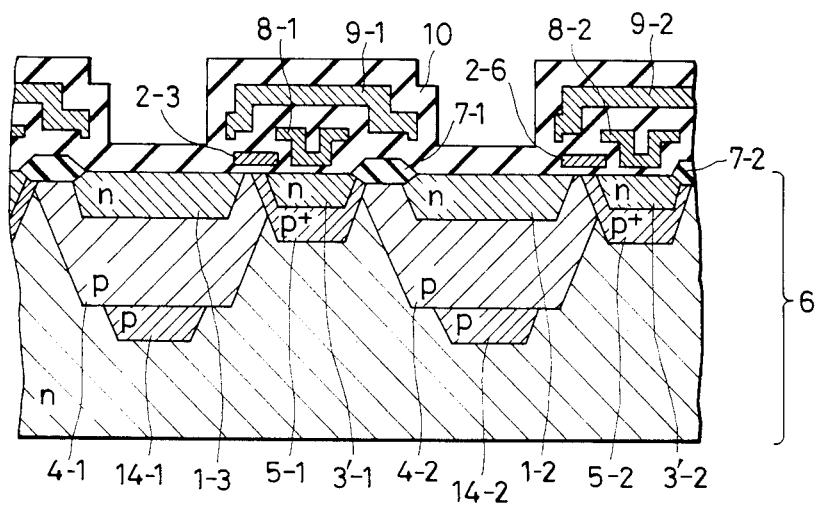
FIG. 4 is a sectional view of an imaging area of a second embodiment of the solid-state imaging device according to the present invention.

A second embodiment of the present invention is shown in FIG. 4. In this embodiment, p-type impurity layers 14-1 and 14-2 are further provided under the p-type impurity layers 4-1 and 4-2 provided around the photo-diodes 1-3 and 1-6, respectively. Accordingly, the arrangement of this embodiment is the same as that of the first embodiment shown in FIG. 3 except that the p-type impurity layers 4-1 and 4-2 are deeper at regions thereof which are at the centers and vicinities of the photo-diodes 1-3 and 1-6. The p-type impurity layers 14-1 and 14-2 can be produced by a method similar to that used in the first embodiment. According to the second embodiment, addition of the p-type impurity layers 14-1 and 14-2 enables an improvement in sensitivity to light of the solid-state imaging device without degrading the smear phenomenon suppressing effect, which is to be improved by the present invention. It should be noted that the p-type impurity layers 14-1 and 14-2 are preferably formed by directly implanting a p-type impurity into the n-type substrate 6 using, for example, the focused ion beam (FIB) method.

THIRD EMBODIMENT

Figure 5:
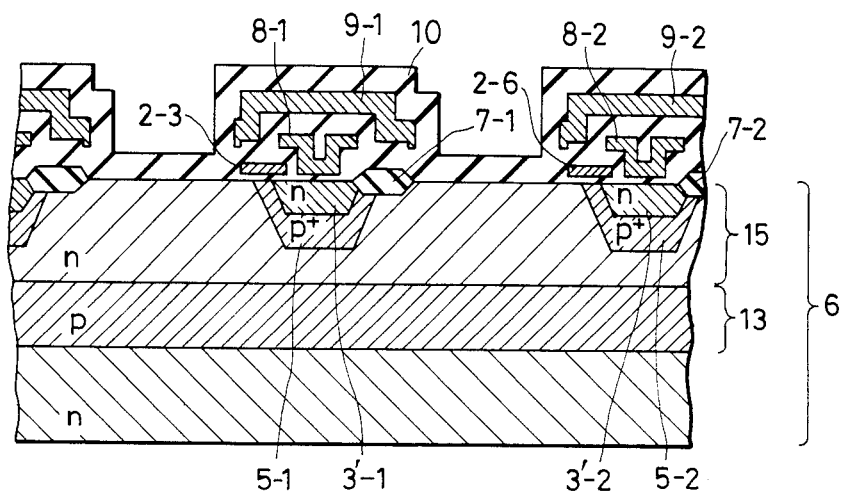
FIG. 5 is a sectional view of an imaging area of a third embodiment of the solid-state imaging device according to the present invention.

A third embodiment of the present invention is shown in FIG. 5. The arrangement of this embodiment is the same as that of the first embodiment except that the channel regions 3'-1, 3'-2 . . . of a plurality of vertical CCD registers 3 and the p+-type impurity layers 5-1, 5-2 . . . are included in one photo-diode 15 and its p-type well 13. In manufacture also, this embodiment can be produced in a manner similar to that in the first embodiment except that the mask which is employed in the first step differs from that employed in the first embodiment. In the first embodiment, the p+-type impurity layers 5-1 and 5-2 around the channel regions 3'-1 and 3'-2 of the vertical CCD registers 3 are provided within the n-type substrate 6 in order to suppress the occurrence of the smear phenomenon, whereas, in the third embodiment, the p+-type impurity layers 5-1 and 5-2 are provided within the n-type photo-diode 15 to obtain a similar suppressive effect. If the operating voltage of the photo-diode 15 is so set that depletion layers are generated under the p+-type impurity layers 5-1 and 5-2, there is no undesirable mixing of charges between imaging areas which are laterally separated from each other by the channel regions 3'-1 and 3'-2 of the vertical CCD registers 3. The same is the case with imaging areas of the device which are longitudinally separated from each other. It should be noted that in the third embodiment the p+-type impurity layers 5-1 and 5-2 around the channel regions 3'-1 and 3'-2 of the vertical CCD registers 3 and the p-type impurity layer 13 of the photo-diode are completely isolated from each other by the photo-diode 15 and, therefore, even if the p-type impurity layer 13 for the photo-diode is made deeper so as to increase the amount of charge generated in the p-type impurity layer 13 for the photo-diode, there is no increase in smear noise at all. This means that there is no change in size of the smear noise even if the photo-sensitivity of the solid-state imaging device is increased, which is a great advantage of this embodiment. As will be clear from the formula (1), this embodiment is particularly excellent in terms of sensitivity to infrared rays.

FOURTH EMBODIMENT

Figure 6:
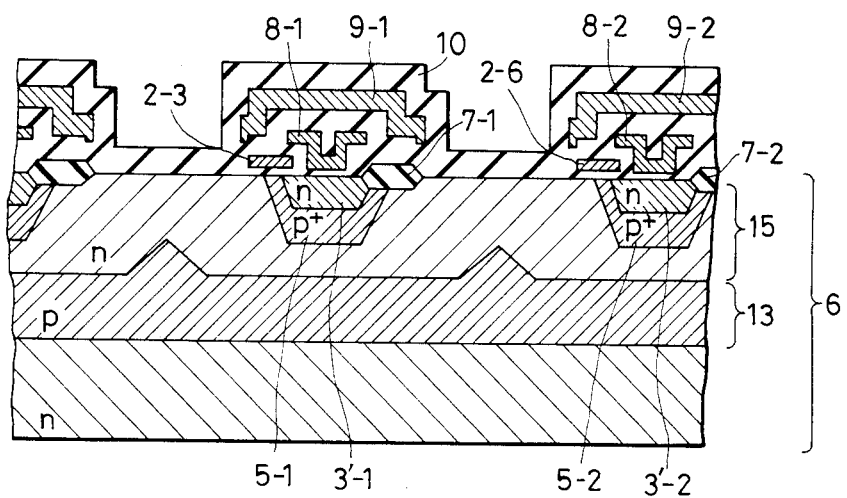
FIG. 6 is a sectional view of an imaging area of a fourth embodiment of the solid-state imaging device according to the present invention.

A fourth embodiment of the present invention is shown in FIG. 6. The arrangement of this embodiment is the same as that of the third embodiment except that the depth of the photo-diode 15 is non-uniform, and the fourth embodiment can similarly be produced simply by changing the mask employed in the first step. In this embodiment, the depth of the photo-diode 15 is partially varied in such a manner that those portions of the photo-diode 15 in which no p+-type impurity layers 5-1, 5-2 around the channel regions 3'-1, 3'-2 of the vertical CCD registers 3 are present are made shallower than the other portions, whereby, when the selector gates 2-1 and 2-2 are ON, the photo-diode 15 is brought into a completely depleted state, thus eliminating persistence of vision. The structure in accordance with this embodiment can readily be obtained in such a manner that an impurity for forming the photodiode n-type layer 15 is implanted in the vicinities of the channel regions 3'-1 and 3'-2 of the vertical CCD registers 3 using a mask and the implanted impurity is then thermally diffused.

FIFTH EMBODIMENT

Figure 7:
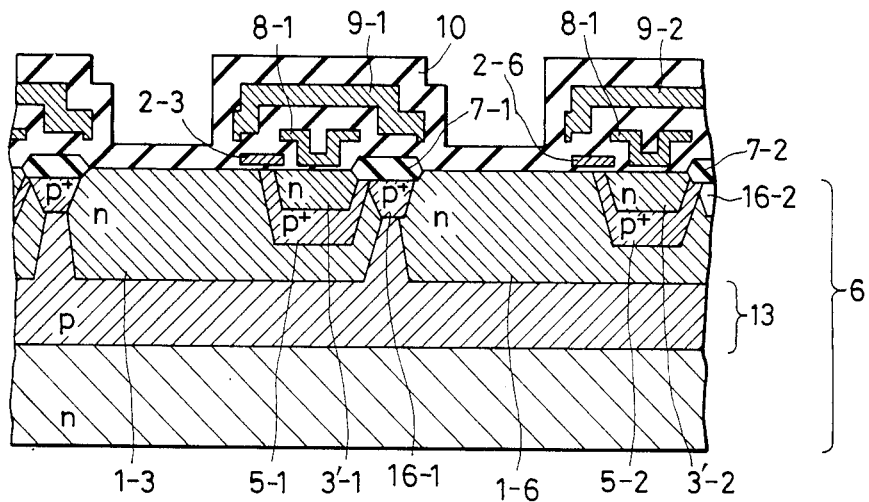
FIG. 7 is a sectional view of an imaging area of a fifth embodiment of the solid-state imaging device according to the present invention.

A fifth embodiment of the present invention is shown in FIG. 7. The arrangement of this embodiment is the same as that of the third embodiment shown in FIG. 5 except that the photo-diodes 1-3 and 1-6 are isolated from each other by p+-type impurity layers 16-1 and 16-2 which are provided under the insulators 7-1 and 7-2, respectively. The smear phenomenon suppressing effect, which is to be improved by the present invention, can be achieved in a manner similar to that in the other embodiments. It should be noted that the insulator 7-1 and 7-2 may be omitted in this embodiment.

Figure 8:
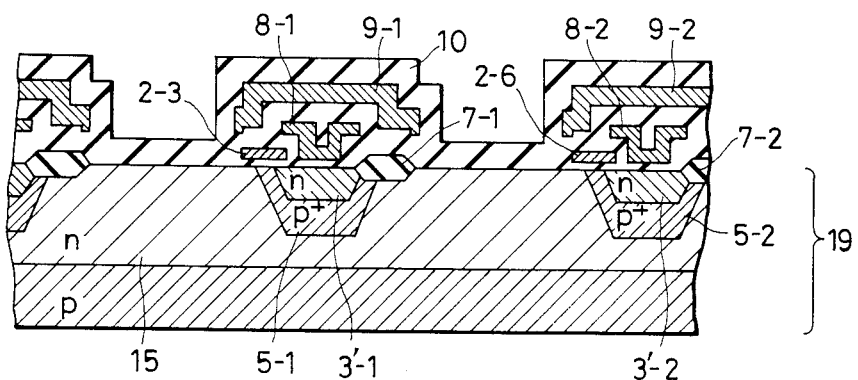
FIGS. 8 and 9 are sectional views of an imaging area of a sixth embodiment of the solid-state imaging device according to the present invention.

Although in the above-described third, fourth and fifth embodiments, the p-type impurity layer 13 is provided on the n-type semiconductor substrate 6, a p-type semiconductor substrate may also be employed in place of the n-type semiconductor substrate 6, as shown in FIG. 8.

SIXTH EMBODIMENT

Figure 9:
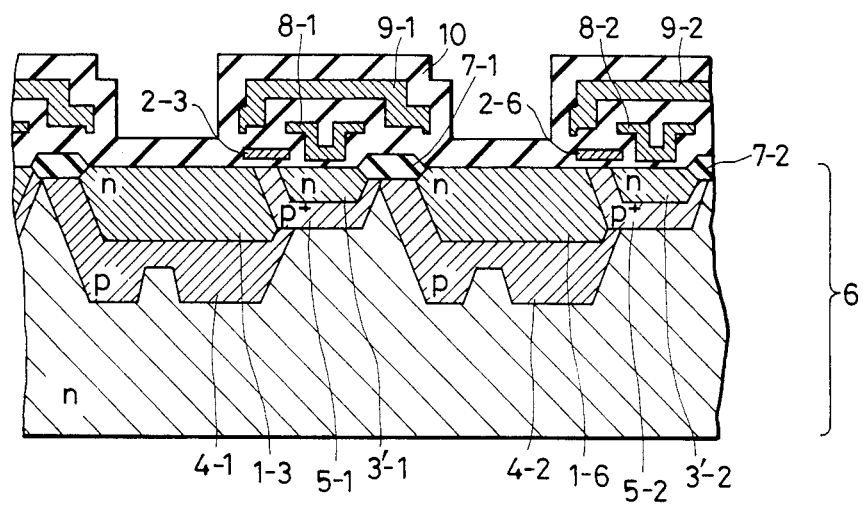

A sixth embodiment of the present invention is shown in FIG. 9. The arrangement of this embodiment is the same as that of the first embodiment shown in FIG. 3 except that a portion of the bottom of each of the p-type impurity layers 4-1 and 4-2 is made shallower than the other portions thereof. This arrangement is designed to form longitudinal over-flow drains and therefore effective in suppressing blooming. It is, of course, possible to combine the arrangement of the first embodiment with usual lateral over-flow drains.

SEVENTH EMBODIMENT

Figure 10:
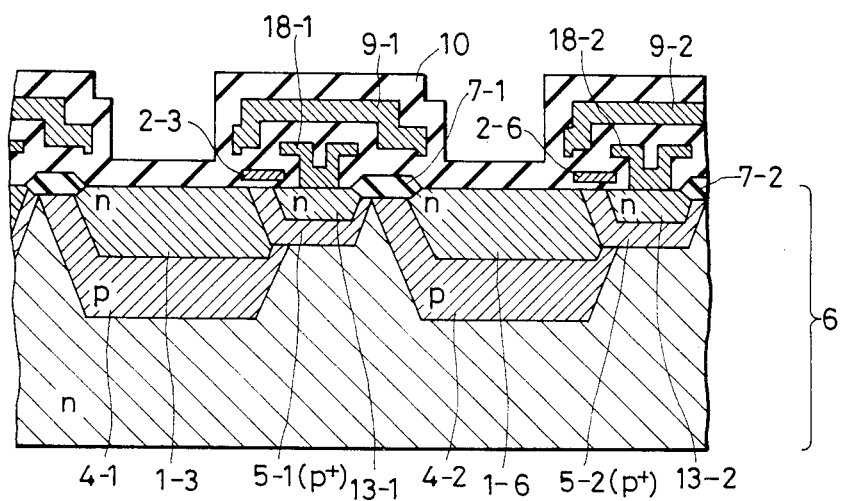
FIG. 10 is a sectional view of an imaging area of a seventh embodiment of the solid-state imaging device according to the present invention.

A seventh embodiment of the present invention is shown in FIG. 10, in which the invention is applied to a MOS type solid-state imaging device. Signal lines 18-1 and 18-2 are respectively connected to drains 13-1 and 13-2 which are defined by n-type semiconductor layers, so as to take out signal charges either vertically or horizontally. This embodiment is the same as the first embodiment except that signal charges are taken out through the signal lines 18-1 and 18-2 as described above. In this embodiment, since the photo-diodes 1-3 and 1-6 are formed so as to be deeper than the p+-type impurity layers 5-1 and 5-2 around the diffused layers 13-1 and 13-2 defining drains, it is possible to effectively suppress the occurrence of the smear phenomenon.

EIGHTH EMBODIMENT

Figure 11:
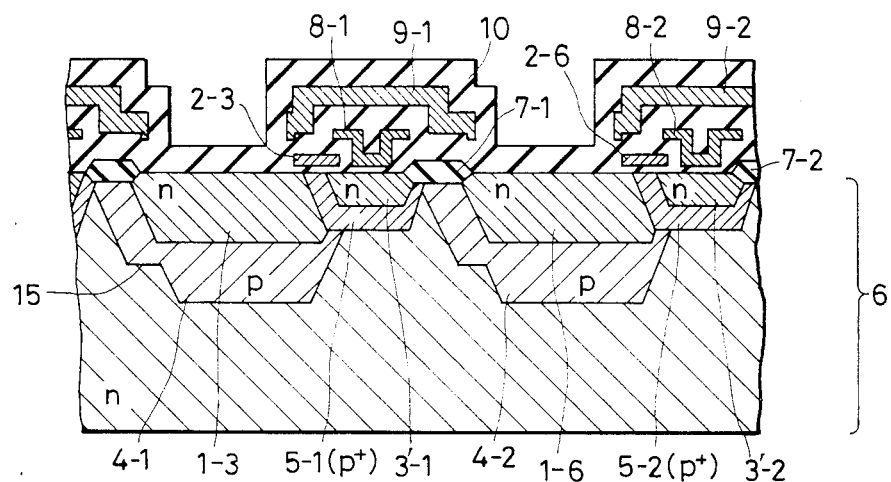
FIG. 11 and 12 are sectional views of an imaging area of an eighth embodiment of the solid-state imaging device according to the present invention.
Figure 12:
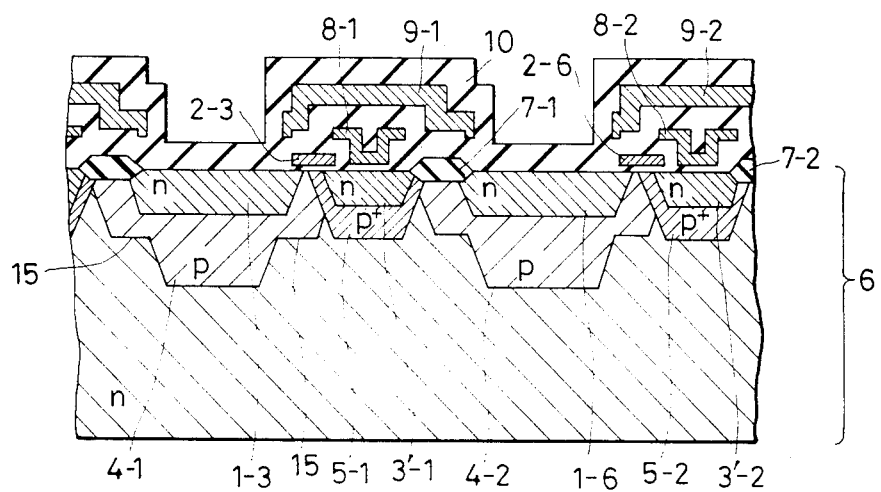

An eighth embodiment of the present invention is shown in FIGS. 11 and 12. In the above-described sixth embodiment (see FIG. 9), a part of the p-type impurity layer 4-1 below the n-type impurity layer of the photo-diode 1-3 is made shallower than the other portion thereof to facilitate depletion generated in the p-type impurity layer 4-1. More specifically, even if excessively strong light is incident on the photo-diode 1-3, an excess charge flows toward the substrate 6 by virtue of the punch-through phenomenon occurring due to the fact that the p-type impurity layer 4-1 is partially made shallow, so that it is possible to prevent the occurrence of the blooming phenomenon that the excess charge overflows into the channel regions 3'-1 and 3'-2 of the vertical CCD registers 3. However, this structure suffers from the problem that the reduction in depth of the p-type impurity layers 4-1 and 4-2 below the photo-diodes 1-3 and 1-6 leads to a decrease in size of depletion layers generated in the photo-diodes 1-3 and 1-6, resulting in a lowering in photo-sensitivity of the device.

Thus, although the sixth embodiment is considerably effective in suppressing the occurrence of the blooming phenomenon, no consideration is taken to photo-sensitivity, and the arrangement of the sixth embodiment lowers the photo-sensitivity, disadvantageously. Accordingly, in the eighth embodiment the p-type impurity layer 4-1 below the photo-electric conversion element 1-3 is made shallower at, at least, a peripheral portion 15 of the element 1-3 than the central portion thereof, as shown in FIG. 11.

It should be noted that the portion 15 at which the impurity layer 4-1 is made shallower may extend all over the periphery of the photo-electric conversion element 1-3 as shown in FIG. 12.

Thus, the depth of depletion layers generated in the central portions of the photo-electric conversion elements 1-3 and 1-6 can be increased by increasing the depth of the p-type impurity layers 4-1 and 4-2 below the respective central portions of the photo-electric conversion elements 1-3 and 1-6, so that it is possible to increase the photo-sensitivity of the photo-electric conversion elements 1-3 and 1-6.

On the other hand, the structure in which each of the p-type impurity layers 4-1 and 4-2 is shallowed at least at a peripheral portion 15 of the corresponding photo-electric conversion element 1-3 (1-6) enables prevention of the occurrence of the blooming phenomenon, since, even if excessively strong light enters the photo-electric conversion elements 1-3 and 1-6, excessd charges flow toward the substrate 6 via the shallowed portions 15 of the p-type impurity layers 4-1 and 4-2 which are provided at the peripheries of the photo-electric conversion elements 4-1 and 4-2 which can be completely depleted.

NINTH EMBODIMENT

Figure 13:
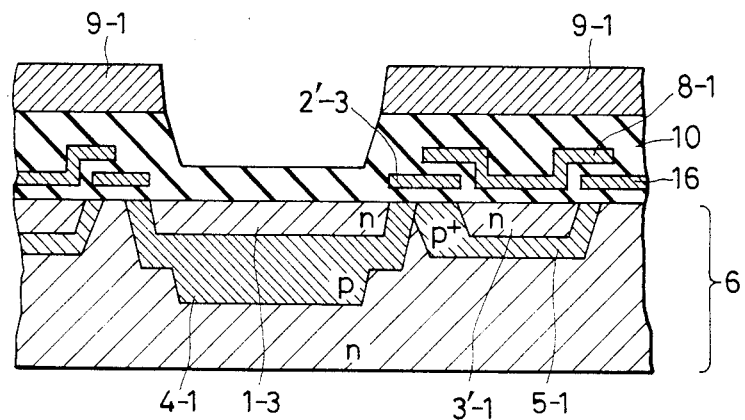
FIGS. 13 and 14 are sectional views of an imaging area of a ninth embodiment of the solid-state imaging device according to the present invention.
Figure 14:
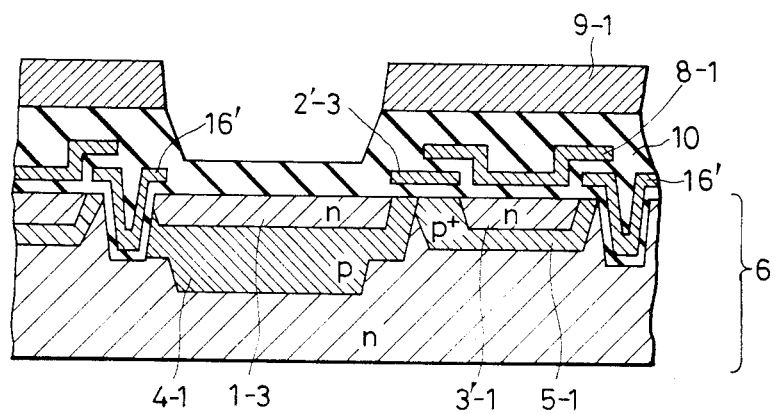

A ninth embodiment of the present invention is shown in FIGS. 13 and 14. In this embodiment, the selector gate 2-3 which constitutes a part of the vertical CCD register 3 in the embodiment shown in FIG. 12 is defined by two separate portions, that is, a selector gate 2'-3 and a field-plate gate 16. The field-plate gate 16 replaces the insulators 7-1 and 7-2 for isolation shown in FIG. 12.

In the arrangement shown in FIG. 14, the field-plate gate 16 in the arrangement shown in FIG. 13 is replaced with a buried type gate 16' as illustrated, thereby forming a vertical MOS field-effect transistor. More specifically, it is possible to form a vertical MOS field-effect transistor having a source defined by the n-type impurity layer 1-3, a gate defined by the buried type gate 16' and a drain defined by the n-type substrate 6. Although in the embodiments shown in FIGS. 9 and 11 to 13, vertical punch-through transistors are utilized to suppress the occurrence of the blooming phenomenon, this embodiment enables suppression of the occurence of the blooming phenomenon by the use of vertical MOS field-effect transistors. In this embodiment also, since the the depth of the central portion of the p-type impurity layer 4-1 below the photo-diode 1-3 can be increased, it is possible to improve the photo-sensitivity of the device.

What is claimed is:
1. A solid-state imaging device comprising:
a semiconductor substrate of a first conductivity type;
a first region of a second conductivity type, complementary to said first conductivity type, which is formed in a surface region of said semiconductor substrate;
a plurality of second regions of the first conductivity type which are two-dimensionally formed in said first region, each of said regions cooperating with said first region to constitute a photo-electric conversion element;

a plurality of third regions of the first conductivity type which are formed in said first region so as to correspond to at least one of said second regions, said first region having a depth into said surface region of said semiconductor substrate which underlies both said plurality of second and third regions;

a plurality of selector gates separated from the surface of said semiconductor substrate by an insulator, and each being disposed over said surface between respective ones of said second and third regions, said selector gates transferring to said third regions charges stored in said photo-electric conversion elements in accordance with light incident thereon;

means for reading out charges transferred to said third regions; and the depth of a portion of said first region adjacent to said semiconductor substrate underlying said second regions being greater than the depth of a portion of said first region adjacent to said semiconductor substrate underlying said third regions.

2. A solid-state imaging device according to claim 1, wherein the depth of said second regions is greater than said depth of said portion of said first region under said third regions.

3. A solid-state imaging device according to claim 1, wherein the impurity concentration in a portion of said first region which is in contact with each of said second regions is lower than the impurity concentration in a portion of said first region which is in contact with each of said third regions.

4. A solid-state imaging device according to claim 1, further comprising a plurality of fourth regions of the second conductivity type which are respectively disposed below and in contact with a portion of said first region which opposes the lower surface of each of said second regions.

5. A solid-state imaging device according to claim 1, wherein said read means comprises:

a plurality of first CCD registers each having a channel region defined by each of said third regions formed in correspondence with said second regions, respectively, said first CCD registers transferring said charges;

a second CCD register provided at one end of said plurality of first CCD registers to receive in parallel said charges transferred through said first CCD registers; and an output amplifier having an input coupled to one end of said second CCD register.

6. A solid-state imaging device according to claim 1, wherein said read means comprises:

a plurality of said third regions formed in correspondence with said second regions, respectively; and signal lines respectively connected to said third semiconductor layers.

7. A solid-state imaging device according to claim 1, wherein the depth of said portion of said first region underlying a part of said second regions has a depth which is less than the remaining portion underlying said respective second regions.

8. A solid-state imaging device according to claim 1, wherein the depth of said portion of said first region underlying at least a part of the periphery of each one of said second regions has a depth which is less than the remaining portion underlying said respective second regions.

9. A solid-state imaging device according to claim 1, wherein the depth of said portion of said first region underlying the entire periphery of each one of said second regions has a depth which is less than the remaining portion underlying said respective second regions.

10. A solid-state imaging device according to claim 1, wherein a field-plate gate is employed as a means for isolating picture elements from each other which are constituted by said second and third regions.

11. A solid-state imaging device according to claim 10, wherein said field-plate gate is buried in said semiconductor substrate to form a MOS field-effect transistor having a source defined by said second regions, a gate defined by said field-plate gate and a drain defined by said semiconductor substrate.

12. A solid-state imaging device comprising:

a semiconductor substrate of a first conductivity type;

a first region of a second conductivity type, complementary to said first conductivity type, which is formed in a surface region of said semiconductor substrate;

a second region of the first conductivity type which is formed in said first region, said second region cooperating with said first region to constitute a photo-electric conversion element;

a plurality of third regions of the second conductivity type which are formed in said second region;

a plurality of fourth regions of the first conductivity type which are formed in said third regions, respectively;

a plurality of selector gates each separated from the surface of said semiconductor substrate by an insulator and being disposed over said surface between said second region and a corresponding one of said fourth regions, said selector gates transferring to said fourth regions charges stored in said photo-electric conversion element in accordance with light incident thereon; and means for reading out said charges transferred to said fourth regions.

13. A solid-state imaging device according to claim 12, wherein the depth of said second region from the surface of said semiconductor substrate is less at that part of said second region located between each pair of adjacent third regions than that part of said second region underlying said third regions.

14. A solid-state imaging device according to claim 12, wherein there are a plurality of said second regions which are two-dimensionally formed in said surface of said semiconductor substrate within said first region, said second regions being isolated from each other by said first region.

15. A solid-state imaging device comprising;

a semiconductor substrate of a first conductivity type;

a plurality of first regions of a second conductivity type, complementary to said first conductivity type, which are formed in a surface region of said semiconductor substrate;

a plurality of second regions of a second conductivity type which are formed in said surface region adjacent to said first regions so as to correspond to at least one of said first regions;

a plurality of third regions of the first conductivity type, each formed in a respective one of said first regions and wherein each of said third regions cooperating with said first regions to constitute a photo-electric conversion element;

a plurality of fourth regions of the first conductivity type each formed in a respective one of said second regions;

a plurality of selector gates separated from the surface of said semiconductor substrate by an insulator and each being disposed over said surface between respective ones of said third and fourth regions, said selector gates transferring to said fourth regions charges stored in said photo-electric conversion elements in accordance with light incident thereon;

means for reading out said charges transferred to said fourth regions; and the depth of a portion of said first regions adjacent to said semiconductor substrate being greater than the depth of a portion of said second regions adjacent to said semiconductor substrate.

16. A solid-state imaging device according to claim 15, wherein the depth of said third regions is greater than said depth of said second regions.

17. A solid-state imaging device according to claim 15, wherein the impurity concentration of said first regions is lower than the impurity concentration of said second regions.

18. A solid-state imaging device according to claim 15, further comprising a plurality of fifth regions of the second conductivity type which is disposed below and in contact with a portion of said first regions under each of said third regions.

19. A solid-state imaging device according to claim 15, wherein said read means comprises:

a plurality of first CCD registers each having a channel region defined by each of said fourth regions formed in correspondence with said third regions, respectively, said first CCD registers transferring said charges;

a second CCD register provided at one end of said plurality of first CCD registers to receive in parallel said charges transferred through said first CCD registers; and an output amplifier having an input coupled to one end of said second CCD register.

20. A solid-state imaging device according to claim 15, wherein said read means comprises:

a plurality of said fourth regions, each one formed in correspondence with a respective one of said plurality of third regions; and signal lines respectively connected to said fourth regions.

21. A solid-state imaging device according to claim 15, wherein the depth of said portion of said first regions underlying a part of respective ones of said third regions is less than the remaining portion underlying each respective third region.

22. A solid-state imaging device according to claim 15, wherein the depth of said portion of said first regions underlying at least a part of the periphery of respective ones of said third regions is less than the remaining portion underlying said third regions.

23. A solid-state imaging device according to claim 15, wherein the depth of said portion of said first regions underlying the entire periphery of respective ones of said third regions is less than the remaining portion underlying said third regions.

24. A solid-state imaging device according to claim 15, wherein a field-plate gate is employed as a means for isolating picture elements from each other which are constituted by said third and fourth regions.

25. A solid-state imaging device according to claim 24, wherein said field-plate gate is buried in said semiconductor substrate to form a MOS field-effect transistor having a source defined by said third regions, a gate defined by said field-plate gate and a drain defined by said semiconductor substrate.

26. A solid-state imaging device comprising:

a semiconductor substrate of a first conductivity type;

a plurality of photo-electric conversion means for converting incident light to a charge corresponding to the intensity of said incident light and storing said charge, said photo-electric conversion means comprising a plurality of first regions of a second conductivity type, complementary to said first conductivity type, which are formed in a surface region of said semiconductor substrate and a plurality of second regions of a first conductivity type, each of said second regions being formed in a respective one of said first regions;

a plurality of charge transfer means for transferring said charge along a first direction, said charge transfer means comprising a plurality of third regions of the second conductivity type which are formed in said surface region of said semiconductor substrate adjacent to said photo-electric conversion means so as to correspond to at least one of said photo-electric conversion means and a plurality of fourth regions of the first conductivity type, each of said fourth regions being formed in a respective one of said third regions;

a plurality of gate means for transferring to said transfer means said charge stored in said photo-electric conversion means, each said gate means comprising a gate electrode separated from the surface of said semiconductor substrate by an insulator disposed over said surface between respective ones of said second and fourth regions;

a charge reading means for transferring respective ones of said charge along a second direction and reading out said charge transferred to said charge transfer means; and the depth of a portion of said first regions adjacent to said semiconductor substrate being greater than the depth of a portion of said third regions adjacent to said semiconductor substrate.

27. A solid-state imaging device according to claim 26, wherein the depth of said second regions is greater than said depth of said fourth regions.

28. A solid-state imaging device according to claim 26, wherein the impurity concentration of said first regions is lower than the impurity concentration of said fourth regions.

29. A solid-state imaging device according to claim 26, further comprising a plurality of fifth regions of the second conductivity type which is disposed below and in contact with a portion of respective ones of said first regions under each of said second regions.

30. A solid-state imaging device according to claim 26, wherein said read means comprises:

a plurality of first CCD registers each having a channel region defined by each of said fourth regions formed in correspondence with said second regions, respectively, said first CCD registers transferring said charges;

a second CCD register provided at one end of said plurality of first CCD registers to receive in parallel said charges transferred through said first CCD registers; and an output amplifier having an input coupled to one end of said second CCD register.

31. A solid-state imaging device according to claim 26, wherein said read means comprises:
a plurality of said fourth regions, each one formed in correspondence with a respective one of said plurality of second regions; and
signal lines respectively connected to said fourth regions.

32. A solid-state imaging device according to claim 26, wherein the depth of said portion of said first regions underlying a part of respective ones of said second regions is less than the remaining portion underlying each respective second region.

33. A solid-state imaging device according to claim 26, wherein the depth of said portion of said first regions underlying at least a part of the periphery of respective ones of said second regions is less than the remaining portion underlying each of said second regions.

34. A solid-state imaging device according to claim 26, wherein the depth of said portion of said first regions underlying the entire periphery of respective ones of said second regions is less than the remaining portion underlying each of said second regions.

35. A solid-state imaging device according to claim 26, wherein a field-plate gate is employed as a means for isolating picture elements from each other which are constituted by said second and fourth regions.

36. A solid-state imaging device according to claim 35, wherein said field-plate gate is buried in said semiconductor substrate to form a MOS field-effect transistor having a source defined by said second regions, a gate defined by said field-plate gate and a drain defined by said semiconductor substrate.

37. A solid-state imaging device comprising:
a semiconductor substrate of a first conductivity type;
a first region of a second conductivity type, complementary to said first conductivity type, which is formed in a surface region of said semiconductor substrate, said first region cooperating with said semiconductor substrate to constitute a photo-electric conversion element;
a plurality of second regions of the first conductivity type which are formed in said first region;
a plurality of third regions of the second conductivity type each being formed in a respective one of said second regions;
a plurality of selector gates each separated from the surface of said semiconductor substrate by an insulator and being disposed over said surface between said first region and a respective one of said third regions, said selector gates transferring to said regions charges stored in said photo-electric conversion elements in accordance with light incident thereon; and
means for reading out said charges transferred to said third regions.

38. A solid-state imaging device according to claim 1, wherein said first region comprises a plurality of individual regions corresponding to the total number of said plurality of second and third regions, each of said second and third regions are formed in respective ones of said plurality of individual regions, and wherein those of said individual regions underlying said second regions having a greater depth into said semiconductor substrate than those underlying said third regions.

* * * * *